(12) United States Patent
Mueller et al.

(10) Patent No.: US 10,912,208 B2
(45) Date of Patent: Feb. 2, 2021

(54) HOUSING CONTACTING SYSTEM OF A CONTROL DEVICE

(71) Applicant: KNORR-BREMSE SYSTEME FUER NUTZFAHRZEUGE GMBH, Munich (DE)

(72) Inventors: Elena Mueller, Nuremberg (DE); Norbert Behrendt, Stein (DE); Klaus Lechner, Pretzfeld (DE); Karin Pohley, Nuremberg (DE)

(73) Assignee: KNORR-BREMSE SYSTEME FUER NUTZFAHRZEUGE GMBH, Munich (DE)

( * ) Notice: Subject to any disclaimer, the term of this patent is extended or adjusted under 35 U.S.C. 154(b) by 45 days.

(21) Appl. No.: 16/332,581

(22) PCT Filed: Sep. 13, 2017

(86) PCT No.: PCT/EP2017/073003
§ 371 (c)(1),
(2) Date: Mar. 12, 2019

(87) PCT Pub. No.: WO2018/050685
PCT Pub. Date: Mar. 22, 2018

(65) Prior Publication Data
US 2020/0015371 A1    Jan. 9, 2020

(30) Foreign Application Priority Data

Sep. 15, 2016  (DE) .................. 10 2016 117 331

(51) Int. Cl.
*H05K 7/10* (2006.01)
*H05K 7/12* (2006.01)
(Continued)

(52) U.S. Cl.
CPC ......... *H05K 5/0069* (2013.01); *H05K 1/0215* (2013.01); *H05K 1/0216* (2013.01); *H05K 7/2049* (2013.01); *H05K 9/0039* (2013.01)

(58) Field of Classification Search
CPC .. H05K 5/0069; H05K 1/0215; H05K 1/0216; H05K 7/2049; H05K 9/0039;
(Continued)

(56) References Cited

U.S. PATENT DOCUMENTS 4,927,367 A * 5/1990 Salvagno ............. H05K 9/0039
                                                200/507
6,049,469 A * 4/2000 Hood, III ............. H05K 9/0039
                                                361/818

(Continued)

FOREIGN PATENT DOCUMENTS

CA  1215744        12/1986
CN  1282504 A      1/2001
(Continued)

OTHER PUBLICATIONS

"Tinning of pronted-circuit boards", (http://www.pk-altonika.ru/dictionary_54.htm), pulling the information in the Internet on Aug. 28, 2016, https://web.archive.org/web/20160828094243/http://www.pk-altonika.ru/dictionary_54.htm, the whole document.
(Continued)

*Primary Examiner* — Yuriy Semenenko
(74) *Attorney, Agent, or Firm* — Norton Rose Fulbright US LLP; Gerard Messina

(57) ABSTRACT

A housing contacting system of a control device, including: a housing cover and a base element which together define an interior of the control device; a printed circuit board having a front side and a rear side, wherein a conductive surface layer is formed on the rear side and the printed circuit board is arranged in the interior; and a spring element which is at
(Continued)

least partially electrically conductive and is arranged between the conductive surface layer and the base element under spring prestress in order to implement rear-side contacting of the printed circuit board. Also described are a related brake control device, a utility vehicle, and a method.

9 Claims, 2 Drawing Sheets

(51) Int. Cl.
  *H05K 5/00* (2006.01)
  *H05K 1/02* (2006.01)
  *H05K 7/20* (2006.01)
  *H05K 9/00* (2006.01)

(58) Field of Classification Search
  CPC .......... H05K 2201/10265; H05K 2201/10371; H05K 9/0086; H05K 5/0217; H05K 5/0247
  See application file for complete search history.

(56) References Cited

U.S. PATENT DOCUMENTS

| | | |
|---|---|---|
| 6,166,464 A | 12/2000 | Grant |
| 7,742,304 B2* | 6/2010 | Heise .................... B60T 8/3675 165/80.3 |
| 7,813,134 B2* | 10/2010 | Katsuro ................ H05K 5/0039 361/714 |
| 2009/0298357 A1 | 12/2009 | Tachikawa et al. |
| 2015/0009642 A1* | 1/2015 | Caclard ................ H05K 5/0047 361/753 |
| 2015/0305169 A1* | 10/2015 | Wakana ................. H05K 5/006 361/709 |

FOREIGN PATENT DOCUMENTS

| | | |
|---|---|---|
| CN | 2475256 Y | 1/2002 |
| CN | 2518229 Y | 10/2002 |
| CN | 1847933 A | 10/2006 |
| CN | 101594763 A | 12/2009 |
| DE | 2936715 A1 | 3/1981 |
| DE | 10205816 | 8/2003 |
| DE | 10205816 A1 | 8/2003 |
| DE | 102012216051 A1 | 12/2013 |
| DE | 102015201234 A1 | 7/2016 |
| DE | 102016201003 A1 | 7/2016 |
| JP | 2003347755 | 12/2003 |
| JP | 2003347755 A | 12/2003 |
| SU | 970740 | 10/1982 |

OTHER PUBLICATIONS

International Search Report dated Dec. 15, 2017, of the corresponding International Application PCT/EP2017/073003 filed Sep. 13, 2017.

* cited by examiner

HOUSING CONTACTING SYSTEM OF A CONTROL DEVICE

FIELD OF THE INVENTION

The present invention relates to a housing contacting system of a control device and, in particular, to an EMC contacting system (EMC=electromagnetic compatibility) in a plastic housing.

BACKGROUND INFORMATION

Control devices often fulfil safety-related functions in vehicles. Problem-free functioning of the electronic components in the control devices is therefore important. When the control devices are accommodated in plastic housings, electromagnetic interference signals can directly enter the interior and reach the electronic components. The electronic components are arranged, for example, on a printed circuit board and the intended EMC contacting (for example by adequate ground contact, shielding, etc.) is intended to prevent the electronic components being negatively affected by the electromagnetic interference signal. Therefore, reliable EMC contacting is very important for problem-free functioning of the control device.

One problem in vehicles is, however, that frequent changes in temperature and vibrations can lead to electrical contacts and, in particular, the EMC contacting system possibly becoming detached or loose over a relatively long period of time and a loose contact being produced. In conventional control devices, direct contacting of the exemplary printed circuit board is performed by a screw connection on a metal sheet which serves, for example, for fastening the control device. A screw connection of this kind can become detached over time due to changes in temperature and vibrations and is often not reliable in the long term. There is therefore a need for alternative solutions in order to ensure reliable contacting of the electronic components in the control device, in particular when used in vehicles.

SUMMARY OF THE INVENTION

The abovementioned problems are solved by a housing contacting system as described herein, a brake control device as described herein, a utility vehicle as described herein or a contacting method as described herein. Further descriptions herein relate to advantageous developments of the housing contacting system as further described herein.

The present invention relates to a housing contacting system of a control device which is suitable for use in vehicles, in particular utility vehicles. The housing contacting system comprises a housing cover and a base element which together define an interior in which a printed circuit board having a front side and a rear side is arranged, wherein a conductive surface layer is formed on the rear side. The housing contacting system further comprises a spring element which is at least partially electrically conductive and is arranged between the conductive surface layer and the base plate under (spring) prestress in order to contact the rear side of printed circuit board.

The housing cover is intended to comprise all housing sections which, apart from a base element, form the housing of the control device. Without limiting the invention to what follows, the housing cover can have, for example, a pot-like shape which is fitted onto the base element in order to protect the electronic components which are arranged in the interior. The front side and the rear side of the printed circuit board define, for example, two opposite sides of the printed circuit board, wherein the front side can be defined, for example, in that the electronic components are fitted onto the printed circuit board from this side and the rear side comprises the corresponding contacting structures between the individual electronic components. However, the front side and rear side can also be defined in a different way, for example at least some of the electronic components can be fitted onto the printed circuit board from the rear side. The exact position of the electronic components is not important for the subject matter of the present invention, but rather the rear side should be defined merely in that EMC contacting (or else ground contacting) is possible, but is not absolutely necessary, from this side.

In further exemplary embodiments, the housing cover contains a plastic material and the base element contains a metal or a cast material.

In further exemplary embodiments, the rear-side contacting of the printed circuit board forms EMC contacting or ground contact.

In further exemplary embodiments, the printed circuit board comprises a tin-plated surface as surface layer, which tin-plated surface can be formed partially or over the full surface area of the rear side The spring element can optionally be fastened to the rear side of the printed circuit board and rest on the base element under spring prestress. The spring element can have, for example, a leaf spring or a helical spring. The printed circuit board or the base element can have a fastening system for the spring element, wherein the fastening prevents lateral displacement parallel to the printed circuit board on its rear side. However, movement perpendicular to the printed circuit board may be possible since the spring force acts in this direction and ensures spring stress between the printed circuit board and the base element for fixing purposes. However, it can optionally also be fixed in this direction.

The present invention also relates to a brake control device comprising a housing contacting system as has been described above. The present invention also relates to a utility vehicle comprising the brake control device.

Therefore, the exemplary embodiments solve said technical problems in that a spring contact is provided, which spring contact connects a base element to one side of the printed circuit board and the spring force ensures permanent contacting, even in the event of changes in temperature or vibrations.

In contrast to conventional housing contacting systems in which the printed circuit board is directly contacted, for example, on the base element by a screw, exemplary embodiments have the following advantages: a simple and cost-effective design is rendered possible, the printed circuit board can be screwed into a plastic housing, wherein the spring action always ensures that there is electrical contact between the printed circuit board and the base element. Therefore, tolerances do not need to be taken into account since the spring force automatically equalizes differences between the distance between the base element and the printed circuit board.

The exemplary embodiments of the present invention will be better understood together with the following detailed description and the accompanying drawings of the different exemplary embodiments which, however, are not intended to be understood such that they limit the disclosure to the specified embodiments, but rather serve merely for explanation and understanding.

DETAILED DESCRIPTION

Figure 1:
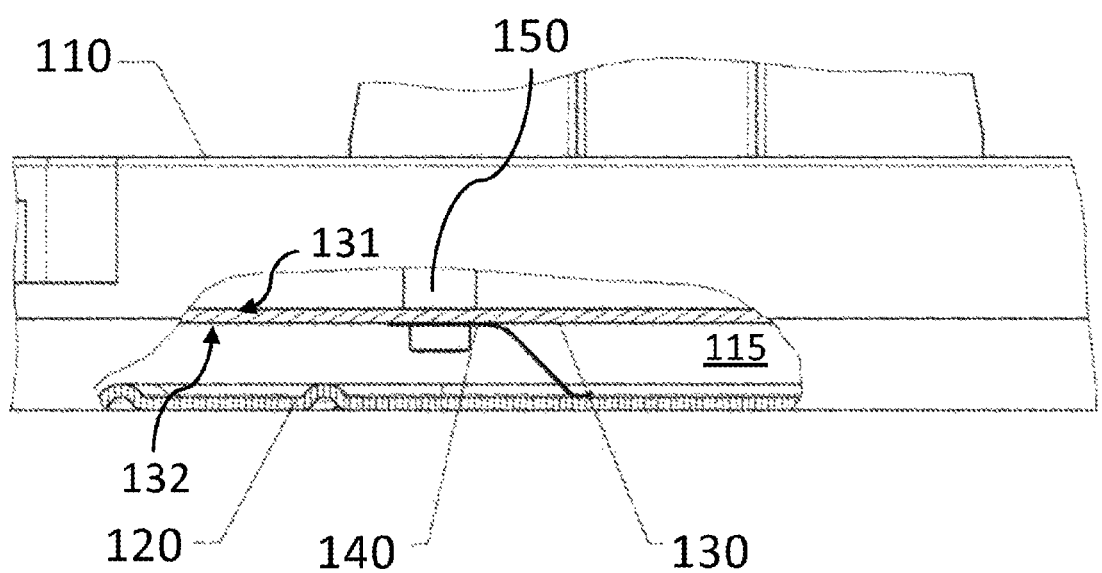
FIG. 1 shows a housing for a control device comprising a housing contacting system as claimed in an exemplary embodiment of the present invention.

FIG. 1 shows a housing comprising a housing contacting system according to an exemplary embodiment of the present invention. The housing is suitable for a control device of a vehicle and comprises a housing cover 110, a base element 120 and a printed circuit board 130 having a front side 131 and a rear side 132. The housing cover 110 and the base element 120 define an interior 115 in which the printed circuit board 130 is arranged. The printed circuit board 130 can be fixed to the housing cover 110, for example, by a holding element 150. A spring contact is formed between the rear side 132 of the printed circuit board 130 and the base element 120 by a spring element 140. The spring element 140 can comprise, for example, a leaf spring which is fixed to a rear side 132 of the printed circuit board 130 and exerts a spring force onto the base element 120, without the spring element 140 having to be fastened to the base element 120. It only needs to rest on said base element. For example, the spring element 140 can be fastened to the printed circuit board 130 in such a way that lateral displacement parallel to the printed circuit board 130 is not possible—but the spring element 140 can be removed from the printed circuit board 130 in a perpendicular direction (for example when the base element 120 is removed) (no fixing of the spring element 140 perpendicular to the printed circuit board).

It is optionally likewise possible for the spring element 140 to be fixed on the base element 120 at least in respect of lateral movement parallel to the printed circuit board and to rest loosely on a rear side 132 of the printed circuit board 130 (that is to say reversal of the abovementioned arrangement). In addition, the spring element 140 can optionally be fastened fixedly to the rear side 132 of the printed circuit board 130 or fixedly on the base element 120 (for example can be soldered or screwed or riveted to/on it).

In addition, the spring element 140 can be configured as a leaf spring or else as a helical spring. However, the present invention is not limited to specific springs. Rather, other types of spring can also be used, provided that they create prestress between the base element 120 and the printed circuit board 130. The rear side and front side 131, 132 of the printed circuit board 130 can also be interchanged. For example, to this end, the holding element 140 can contain a conductive material which creates a plated-through hole through the printed circuit board 130 and therefore electrical contact to the opposite side.

The housing cover 110 can be, for example, a plastic housing. The base element 120 can contain, for example, a metal or a cast material or can be configured as a metal sheet which serves, for example, for fastening the control device (for example to a vehicle frame). The spring element 140 can ensure reliable EMC contacting, to which end the printed circuit board 130 can have, for example, a tin-plated surface, which defines an EMC land, on the rear side 132.

Figure 2:
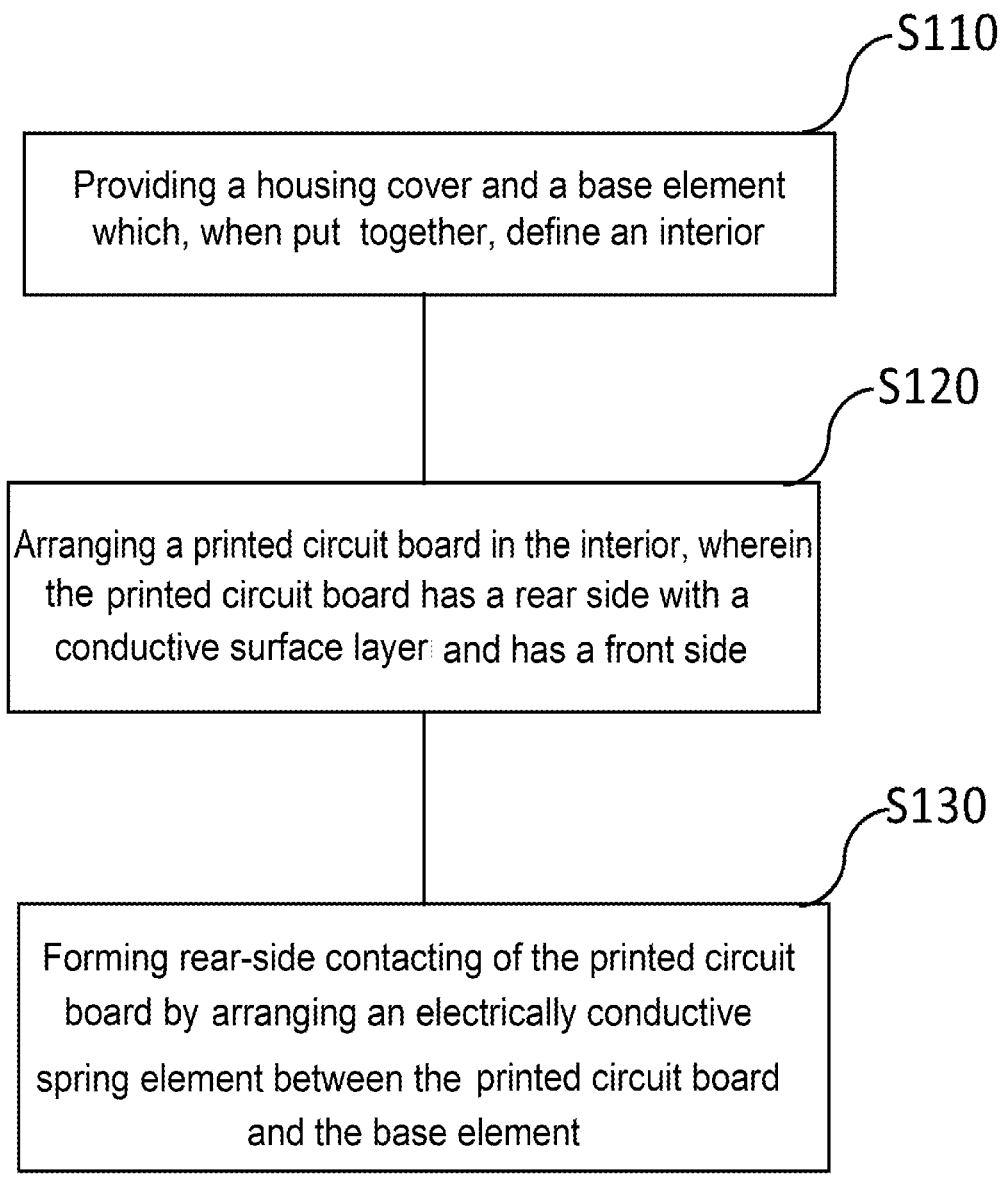
FIG. 2 shows a flowchart for a method for establishing EMC contacting in a plastic housing.

FIG. 2 shows a flowchart for a method for EMC contacting a printed circuit board in a housing. The method comprises the steps of: providing S110 a housing cover 110 and a base element 120 which, when put together, define an interior 115, and arranging S120 a printed circuit board 130 in the interior 115, wherein the printed circuit board 130 has a front side and a rear side with a conductive surface layer. The method also comprises the step of forming S130 rear-side contacting of the printed circuit board 130 by a spring element 140 which is electrically conductive and is arranged between the conductive surface layer and the base plate 120 under (spring) prestress.

The features of the invention which are disclosed in the description, the claims and the figures may be essential for implementing the invention both individually and also in any combination.

THE LIST OF REFERENCE SYMBOLS IS AS FOLLOWS

110 Housing cover
120 Base element
115 Interior
130 Printed circuit board
131 Front side
132 Rear side
140 Spring element
150 Holding element

The invention claimed is:

1. A housing contacting system of a control device, comprising:
   a housing cover and a base element which together define an interior of the control device;
   a printed circuit board having a front side and a rear side, wherein a conductive surface layer is formed on the rear side and the printed circuit board is arranged in the interior; and
   a spring element which is electrically conductive and is arranged between the conductive surface layer and the base element under spring prestress to implement rear-side contacting of the printed circuit board;
   wherein the printed circuit board is fixed to the housing cover by a holding element,
   wherein one end of the spring element only contacts the rear side of the printed circuit board and an opposite end of the spring element only contacts the base element,
   wherein the spring element is one of: (a) fastened fixedly to the rear side of the printed circuit board and exerts a spring force onto the base element, so that the spring element rests on and is not fastened to the base element and (b) fastened fixedly on the base element at least in respect of lateral movement parallel to the printed circuit board and rests on the rear side of the printed circuit board, and
   wherein the spring element is fastened to the printed circuit board or the base element so that lateral displacement parallel to the printed circuit board is not possible, and wherein the spring element is removable from the printed circuit board in a perpendicular direction, when the base element is removed.

2. The housing contacting system of claim 1, wherein the housing cover contains a plastic material and the base element contains a metal or a cast material.

3. The housing contacting system of claim 1, wherein the rear-side contacting of the printed circuit board forms EMC contacting or ground contact.

4. The housing contacting system of claim 1, wherein the printed circuit board has a tin-plated surface as a surface layer.

5. The housing contacting system of claim 1, wherein the spring element is fastened to the rear side of the printed circuit board and rests on the base element under spring prestress.

6. The housing contacting system of claim 1, wherein the spring element has a leaf spring or a helical spring, and the printed circuit board or the base element has a fastening system for the spring element, and wherein the fastening prevents lateral displacement parallel to the printed circuit board.

7. A brake control device, comprising:
a housing contacting system of a control device, including:
   a housing cover and a base element which together define an interior of the control device;
   a printed circuit board having a front side and a rear side, wherein a conductive surface layer is formed on the rear side and the printed circuit board is arranged in the interior; and
   a spring element which is electrically conductive and is arranged between the conductive surface layer and the base element under spring prestress to implement rear-side contacting of the printed circuit board;
   wherein the printed circuit board is fixed to the housing cover by a holding element,
   wherein one end of the spring element only contacts the rear side of the printed circuit board and an opposite end of the spring element only contacts the base element,
   wherein the spring element is one of: (a) fastened fixedly to the rear side of the printed circuit board and exerts a spring force onto the base element, so that the spring element rests on and is not fastened to the base element and (b) fastened fixedly on the base element at least in respect of lateral movement parallel to the printed circuit board and rests on the rear side of the printed circuit board, and
   wherein the spring element is fastened to the printed circuit board or the base element so that lateral displacement parallel to the printed circuit board is not possible, and wherein the spring element is removable from the printed circuit board in a perpendicular direction, when the base element is removed.

8. A utility vehicle, comprising:
a brake control device, having a housing contacting system of a control device, including:
   a housing cover and a base element which together define an interior of the control device;
   a printed circuit board having a front side and a rear side, wherein a conductive surface layer is formed on the rear side and the printed circuit board is arranged in the interior; and
   a spring element which is electrically conductive and is arranged between the conductive surface layer and the base element under spring prestress to implement rear-side contacting of the printed circuit board;
   wherein the printed circuit board is fixed to the housing cover by a holding element,
   wherein one end of the spring element only contacts the rear side of the printed circuit board and an opposite end of the spring element only contacts the base element,
   wherein the spring element is one of: (a) fastened fixedly to the rear side of the printed circuit board and exerts a spring force onto the base element, so that the spring element rests on and is not fastened to the base element and (b) fastened fixedly on the base element at least in respect of lateral movement parallel to the printed circuit board and rests on the rear side of the printed circuit board, and
   wherein the spring element is fastened to the printed circuit board or the base element so that lateral displacement parallel to the printed circuit board is not possible, and wherein the spring element is removable from the printed circuit board in a perpendicular direction, when the base element is removed.

9. A method for EMC contacting a printed circuit board in a control device, the method comprising:
providing a housing cover and a base element which, when put together, define an interior of the control device;
arranging a printed circuit board in the interior, wherein the printed circuit board has a rear side with a conductive surface layer and has a front side; and
forming rear-side contacting of the printed circuit board by a spring element which is electrically conductive and is arranged between the conductive surface layer and the base plate under spring prestress;
wherein the printed circuit board is fixed to the housing cover by a holding element,
wherein one end of the spring element only contacts the rear side of the printed circuit board and an opposite end of the spring element only contacts the base element,
wherein the spring element is one of: (a) fastened fixedly to the rear side of the printed circuit board and exerts a spring force onto the base element, so that the spring element rests on and is not fastened to the base element and (b) fastened fixedly on the base element at least in respect of lateral movement parallel to the printed circuit board and rests on the rear side of the printed circuit board, and
wherein the spring element is fastened to the printed circuit board or the base element so that lateral displacement parallel to the printed circuit board is not possible, and wherein the spring element is removable from the printed circuit board in a perpendicular direction, when the base element is removed.

\* \* \* \* \*